(12) United States Patent
Kobayashi et al.

(10) Patent No.: US 11,736,835 B2
(45) Date of Patent: Aug. 22, 2023

(54) SOLID-STATE IMAGING DEVICE AND AMPLIFIER ARRAY

(71) Applicant: HAMAMATSU PHOTONICS K.K., Hamamatsu (JP)

(72) Inventors: Makoto Kobayashi, Hamamatsu (JP); Chihiro Suzuki, Hamamatsu (JP); Sho Morita, Hamamatsu (JP); Hiroo Yamamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/791,004

(22) PCT Filed: Jan. 6, 2021

(86) PCT No.: PCT/JP2021/000219
§ 371 (c)(1),
(2) Date: Jul. 6, 2022

(87) PCT Pub. No.: WO2021/145254
PCT Pub. Date: Jul. 22, 2021

(65) Prior Publication Data
US 2023/0025939 A1   Jan. 26, 2023

(30) Foreign Application Priority Data
Jan. 16, 2020   (JP) ................................ 2020-004974

(51) Int. Cl.
*H04N 25/778*   (2023.01)
*H03F 3/16*   (2006.01)
(Continued)

(52) U.S. Cl.
CPC ............ *H04N 25/778* (2023.01); *H03F 3/16* (2013.01); *H01L 31/03046* (2013.01); *H03F 2200/144* (2013.01)

(58) Field of Classification Search
CPC .... H04N 25/778; H04N 25/51; H04N 25/671; H04N 25/77; H03F 3/16; H03F 2200/144; H01L 31/03046
See application file for complete search history.

(56) References Cited

U.S. PATENT DOCUMENTS

| 7,642,846 B2 | 1/2010 | Yan |
| 10,209,374 B2 * | 2/2019 | Izuka ................... H01L 17/146 |

(Continued)

FOREIGN PATENT DOCUMENTS

| JP | 2006-505975 A | 2/2006 |
| JP | 2012-004879 A | 1/2012 |

(Continued)

OTHER PUBLICATIONS

International Preliminary Report on Patentability dated Jul. 28, 2022 for PCT/JP2021/000219.

(Continued)

*Primary Examiner* — Marly S Camargo
(74) *Attorney, Agent, or Firm* — Faegre Drinker Biddle & Reath LLP (57) ABSTRACT

A solid-state imaging device includes M pixel units to and a correction unit. The pixel unit includes a main amplifier, a capacitive element, a first switch, a second switch, a photodiode, a feedback capacitive element, and an initialization switch. The correction unit includes a null amplifier, a capacitive element, a first switch, and a second switch. An effective offset voltage of the main amplifier is small.

12 Claims, 6 Drawing Sheets

(51) Int. Cl.
*H01L 31/0304* (2006.01)
*H04N 25/51* (2023.01)

(56) References Cited

U.S. PATENT DOCUMENTS

| | | | |
|---|---|---|---|
| 2005/0134307 A1* | 6/2005 | Stojanovic | H01L 15/03057 326/31 |
| 2005/0199813 A1* | 9/2005 | Bogget | H03F 3/45977 250/208.1 |
| 2009/0108929 A1* | 4/2009 | Yan | H03F 1/02 330/9 |
| 2013/0284893 A1* | 10/2013 | Kyushima | H01L 27/14645 250/208.1 |

FOREIGN PATENT DOCUMENTS

| | | |
|---|---|---|
| JP | 2012-151552 A | 8/2012 |
| WO | WO-2004/043062 A1 | 5/2004 |
| WO | WO-2017/010202 A1 | 1/2017 |

OTHER PUBLICATIONS

"AD8551 / AD8552 / AD8554 Data Sheet," Analog Devices, Inc., 2015, p. 1-p. 24.

* cited by examiner

SOLID-STATE IMAGING DEVICE AND AMPLIFIER ARRAY

TECHNICAL FIELD

The present disclosure relates to a solid-state imaging device and an amplifier array used in the solid-state imaging device.

BACKGROUND ART

In a solid-state imaging device, a plurality of pixel units each including a photodiode are arranged one-dimensionally or two-dimensionally, and each photodiode is connected to an amplifier.

Further, the solid-state imaging device outputs a signal according to a light incident amount to each photodiode from the amplifier. The following two methods are known as methods for outputting the signal according to the light incident amount to the photodiode from the amplifier.

In the first method, a signal according to a potential difference (photovoltaic power) between a cathode and an anode of the photodiode is output from the amplifier while a charge generated in response to light incidence in the photodiode is accumulated in a junction capacitance of the photodiode without flowing the charge to the outside.

In the second method, the cathode and the anode of the photodiode are set to be the same potential, the charge generated in response to light incidence in the photodiode is accumulated in a capacitive element, and a signal according to an accumulated charge amount in the capacitive element is output from the amplifier.

As the photodiode, in addition to a photodiode formed of silicon (Si), a photodiode formed of a compound semiconductor (for example, InGaAs-based, InAsSb-based) is known. A wavelength region in which the photodiode has sensitivity is different depending on the material. For example, a photodiode formed of Si has sensitivity in a visible region to a near-infrared region. A photodiode formed of an InGaAs-based compound semiconductor has sensitivity in a near-infrared region. A photodiode formed of an InAsSb-based compound semiconductor has sensitivity in a mid-infrared region. Therefore, an appropriate photodiode is used according to the wavelength region to be measured or imaged.

CITATION LIST

Patent Literature

Patent Document 1: Japanese Patent Application Laid-Open Publication No. 2006-505975

Non Patent Literature

Non Patent Document 1: Analog Devices, Inc. AD8551/AD8552/AD8554 Data Sheet

SUMMARY OF INVENTION

Technical Problem

A relation (VI characteristics) between a current and a potential difference between the cathode and the anode of the photodiode is different depending on the light incident amount. Further, the sensitivity of the photodiode formed of a compound semiconductor (in particular, InAsSb-based) sensitively changes in response to a temperature change, and a slope of the VI characteristics is different depending on the temperature. In addition, even when the slope of the VI characteristics changes due to the temperature, when an offset voltage of the amplifier is 0, the current when the potential difference between the cathode and the anode of the photodiode is 0 hardly changes.

Therefore, for performing a highly accurate measurement using such a photodiode, strict temperature control may be performed in the case of using the first method, and an amplifier having a very small offset voltage may be used in the case of using the second method (refer to Patent Document 1 and Non Patent Document 1).

However, since an expensive cooler such as a dewar is required for performing strict temperature control, it can be adopted in a system in a laboratory but cannot be adopted in a widespread system.

Further, when an amplifier having a very small offset voltage is used, a layout area of each amplifier becomes large when the amplifier is formed on a semiconductor substrate because a circuit scale of the amplifier is large. For this reason, there is a limit in narrowing a pitch of a plurality of photodiodes formed on the semiconductor substrate, and there is also a limit in increasing the number of photodiodes (number of pixels) formed on the semiconductor substrate.

An object of the present invention is to provide a solid-state imaging device in which temperature control is unnecessary or simple and a pitch of pixels can be narrowed, and an amplifier array suitably used in the solid-state imaging device.

Solution to Problem

An embodiment of the present invention is a solid-state imaging device. The solid-state imaging device includes a plurality of pixel units; a correction unit; and a control unit.

In the above solid-state imaging device, each of the plurality of pixel units includes (1) a main amplifier having a first input terminal, a second input terminal, a third input terminal, and an output terminal, and for outputting, from the output terminal, a voltage value according to a sum of a product of a first gain and a potential difference of the first input terminal with respect to the second input terminal and a product of a second gain and a potential difference of the third input terminal with respect to the second input terminal; (2) a capacitive element connected to the third input terminal of the main amplifier; (3) a first switch connected to the first input terminal of the main amplifier; (4) a second switch connected to the third input terminal of the main amplifier; (5) a photodiode connected to the first input terminal of the main amplifier; (6) a feedback capacitive element provided between the first input terminal and the output terminal of the main amplifier, and for accumulating a charge generated in the photodiode in response to light incidence; and (7) an initialization switch provided in parallel with the feedback capacitive element.

In the above solid-state imaging device, the correction unit includes (1) a null amplifier having a first input terminal, a second input terminal, a third input terminal, and an output terminal, the first input terminal being connected to the first switch of each of the plurality of pixel units, the output terminal being connected to the second switch of each of the plurality of pixel units, and for outputting, from the output terminal, a voltage value according to a difference between a product of a first gain and a potential difference of the first input terminal with respect to the second input terminal and a product of a second gain and a potential difference of the third input terminal with respect to the second input terminal; (2) a capacitive element connected to the third input terminal of the null amplifier; (3) a first switch provided between the first input terminal and the second input terminal of the null amplifier; and (4) a second switch provided between the third input terminal and the output terminal of the null amplifier.

In the above solid-state imaging device, the control unit is configured to perform initialization and charge accumulation of the feedback capacitive element by controlling ON/OFF of the initialization switch for each of the plurality of pixel units, set the first switch and the second switch to an ON state sequentially for each of the plurality of pixel units, and set the first switch and the second switch of the correction unit to the ON state in a period in which the first switches and the second switches of all of the plurality of pixel units are set to an OFF state.

An embodiment of the present invention is an amplifier array. The amplifier array includes a plurality of pixel units; and a correction unit formed on a first semiconductor substrate.

In the above amplifier array, each of the plurality of pixel units includes (1) a main amplifier having a first input terminal, a second input terminal, a third input terminal, and an output terminal, and for outputting, from the output terminal, a voltage value according to a sum of a product of a first gain and a potential difference of the first input terminal with respect to the second input terminal and a product of a second gain and a potential difference of the third input terminal with respect to the second input terminal; (2) a capacitive element connected to the third input terminal of the main amplifier; (3) a first switch connected to the first input terminal of the main amplifier; (4) a second switch connected to the third input terminal of the main amplifier; (5) a feedback capacitive element provided between the first input terminal and the output terminal of the main amplifier; and (6) an initialization switch provided in parallel with the feedback capacitive element.

In the above amplifier array, the correction unit includes (1) a null amplifier having a first input terminal, a second input terminal, a third input terminal, and an output terminal, the first input terminal being connected to the first switch of each of the plurality of pixel units, the output terminal being connected to the second switch of each of the plurality of pixel units, and for outputting, from the output terminal, a voltage value according to a difference between a product of a first gain and a potential difference of the first input terminal with respect to the second input terminal and a product of a second gain and a potential difference of the third input terminal with respect to the second input terminal; (2) a capacitive element connected to the third input terminal of the null amplifier; (3) a first switch provided between the first input terminal and the second input terminal of the null amplifier; and (4) a second switch provided between the third input terminal and the output terminal of the null amplifier.

An embodiment of the present invention is a solid-state imaging device. The solid-state imaging device includes the amplifier array of the above configuration; and a photodiode array including a plurality of photodiodes formed on a second semiconductor substrate, and the first input terminal of the main amplifier of each pixel unit in the amplifier array and each photodiode in the photodiode array are connected in one-to-one correspondence.

Advantageous Effects of Invention

In the solid-state imaging device according to the embodiment of the present invention, temperature control is unnecessary or simple, and a pitch of pixels can be narrowed.

DESCRIPTION OF EMBODIMENTS

Hereinafter, embodiments of a solid-state imaging device and an amplifier array will be described in detail with reference to the accompanying drawings. In the description of the drawings, the same elements will be denoted by the same reference signs, and redundant description will be omitted. The present invention is not limited to these examples.

Figure 1:
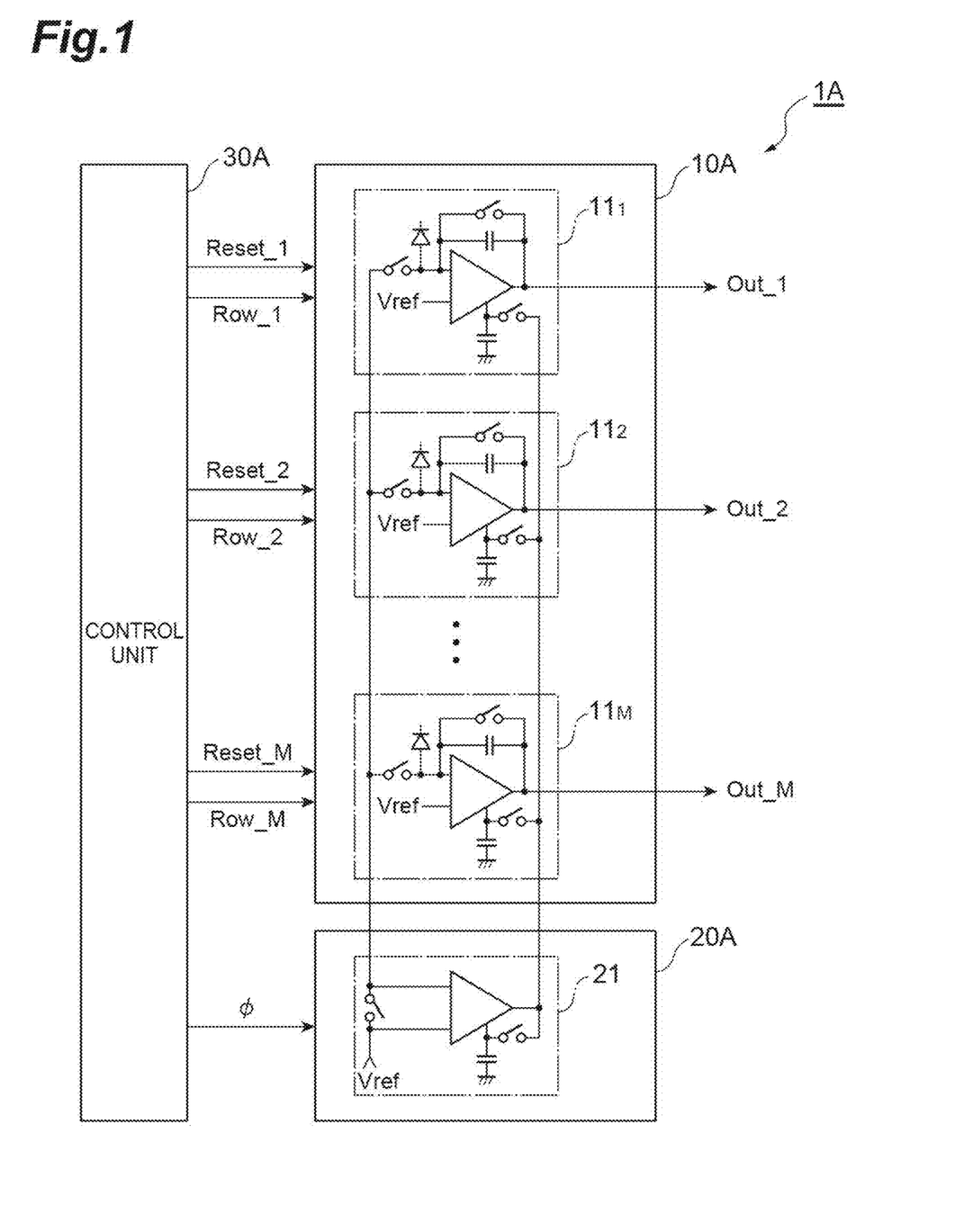
FIG. 1 is a diagram illustrating a configuration of a solid-state imaging device 1A according to a first embodiment.

FIG. 1 is a diagram illustrating a configuration of a solid-state imaging device 1A according to a first embodiment. The solid-state imaging device 1A includes a first circuit unit 10A including M pixel units $11_1$ to $11_M$, a second circuit unit 20A including a correction unit 21, and a control unit 30A.

The single correction unit 21 is provided for the M pixel units $11_1$ to $11_M$. The M pixel units $11_1$ to $11_M$ have a common configuration. The M pixel units $11_1$ to $11_M$ may be arranged one-dimensionally. The control unit 30A controls ON/OFF of each switch included in each pixel unit $11_m$ and the correction unit 21. In addition, M is an integer of 2 or more, and m is an integer of 1 or more and M or less.

Figure 2:
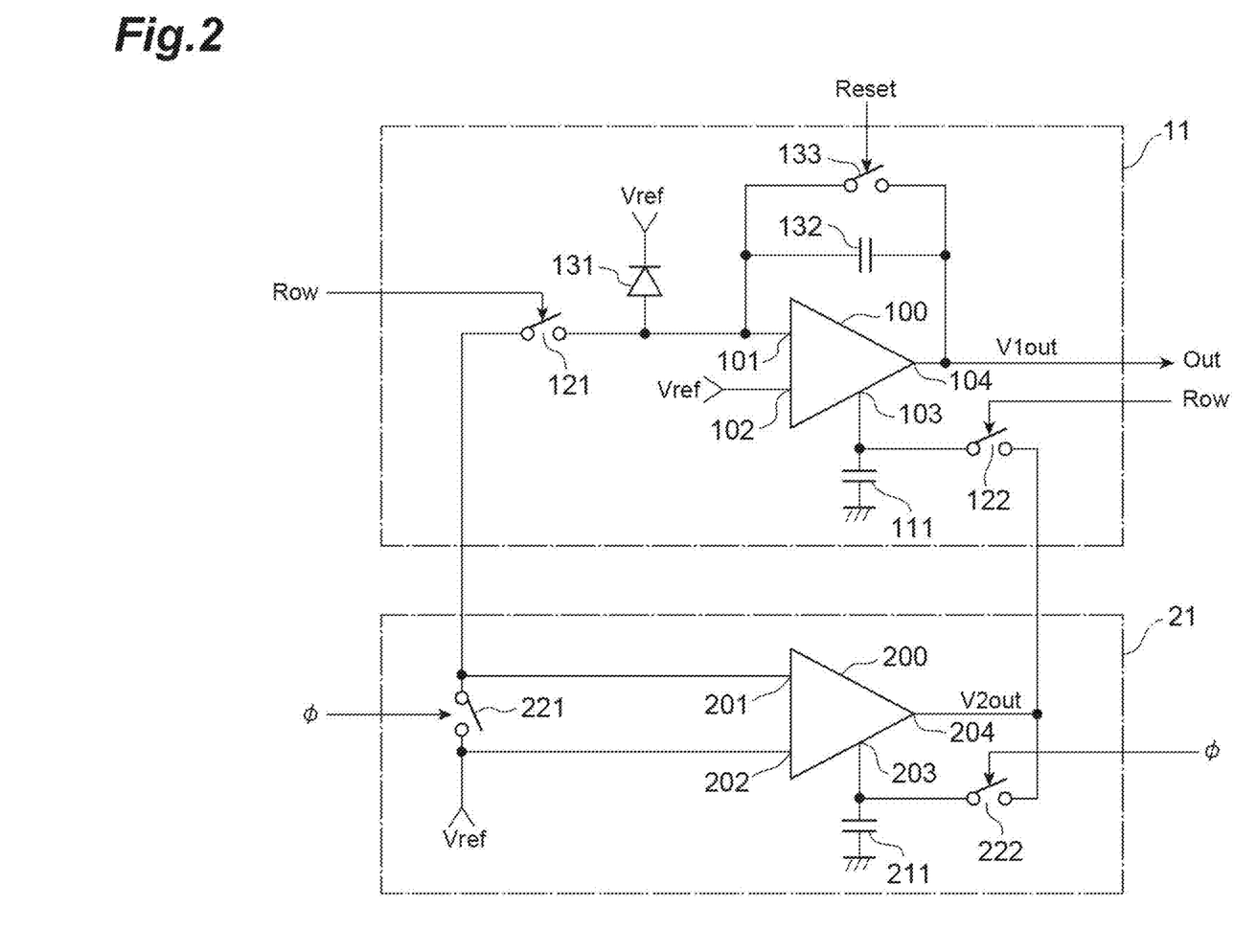
FIG. 2 is a diagram illustrating a configuration of a pixel unit 11 and a correction unit 21.

FIG. 2 is a diagram illustrating a configuration of the pixel unit 11 and the correction unit 21. The pixel unit 11 illustrated in this figure is any one of the M pixel units $11_1$ to $11_M$. The pixel unit 11 includes a main amplifier 100, a capacitive element 111, a first switch 121, a second switch 122, a photodiode 131, a feedback capacitive element 132, and an initialization switch 133. The correction unit 21 includes a null amplifier 200, a capacitive element 211, a first switch 221, and a second switch 222.

The main amplifier 100 of the pixel unit 11 includes a first input terminal 101, a second input terminal 102, a third input terminal 103, and an output terminal 104. A reference voltage Vref is input to the second input terminal 102 of the main amplifier 100. It is assumed that a potential difference of the first input terminal 101 with respect to the second input terminal 102 is $V_{11}$, an open loop gain (first gain) of these two input terminals is $G_{11}$, and an offset voltage of these two input terminals is $V_{1OS}$. It is assumed that a potential difference of the third input terminal 103 with respect to the second input terminal 102 is $V_{13}$, and an open loop gain (second gain) of these two input terminals is $G_{13}$.

A voltage value $V_{1out}$ output from the output terminal 104 of the main amplifier 100 is represented by the following Formula (1). The voltage value $V_{1out}$ is obtained by adding $G_{11}V_{1OS}$, being an effect of the offset voltage $V_{1OS}$, to a sum of $G_{11}V_{11}$ and $G_{13}V_{13}$.

[Formula 1]

$$V_{1out} = G_{11}(V_{11} + V_{1OS}) + G_{13}V_{13} \quad (1)$$

One end of the capacitive element 111 is connected to the third input terminal 103 of the main amplifier 100, and the other end of the capacitive element 111 is set to a ground potential. One end of the first switch 121 is connected to the first input terminal 101 of the main amplifier 100. One end of the second switch 122 is connected to the third input terminal 103 of the main amplifier 100.

An anode of the photodiode 131 is connected to the first input terminal 101 of the main amplifier 100, and the reference voltage Vref is input to a cathode of the photodiode 131. The feedback capacitive element 132 is provided between the first input terminal 101 and the output terminal 104 of the main amplifier 100, and can accumulate a charge generated in the photodiode 131 in response to light incidence. The initialization switch 133 is provided in parallel with the feedback capacitive element 132. The initialization switch 133 initializes charge accumulation of the feedback capacitive element 132 when it is in an ON state, and causes the feedback capacitive element 132 to perform charge accumulation when it is in an OFF state.

The null amplifier 200 of the correction unit 21 includes a first input terminal 201, a second input terminal 202, a third input terminal 203, and an output terminal 204. The reference voltage Vref is input to the second input terminal 202 of the null amplifier 200. It is assumed that a potential difference of the first input terminal 201 with respect to the second input terminal 202 is $V_{21}$, an open loop gain (first gain) of these two input terminals is $G_{21}$, and an offset voltage of these two input terminals is $V_{2OS}$. It is assumed that a potential difference of the third input terminal 203 with respect to the second input terminal 202 is $V_{23}$, and an open loop gain (second gain) of these two input terminals is $G_{23}$.

A voltage value $V_{2out}$ output from the output terminal 204 of the null amplifier 200 is represented by the following Formula (2). The voltage value $V_{2out}$ is obtained by adding $G_{21}V_{2OS}$, being an effect of the offset voltage $V_{2OS}$, to a difference between $G_{21}V_{21}$ and $G_{23}V_{23}$.

[Formula 2]

$$V_{2out} = G_{21}(V_{21} + V_{2OS}) - G_{23}V_{23} \quad (2)$$

The first input terminal 201 of the null amplifier 200 is connected to the other end of the first switch 121 of the pixel unit 11. The output terminal 204 of the null amplifier 200 is connected to the other end of the second switch 122 of the pixel unit 11. One end of the capacitive element 211 is connected to the third input terminal 203 of the null amplifier 200, and the other end of the capacitive element 211 is set to the ground potential. The first switch 221 is provided between the first input terminal 201 and the second input terminal 202 of the null amplifier 200. The second switch 222 is provided between the third input terminal 203 and the output terminal 204 of the null amplifier 200.

Next, an operation of the one arbitrary pixel unit 11 and the correction unit 21 will be described with a first period and a second period, and further, reduction of an effective offset voltage of the main amplifier 100 will be described. In addition, the first period and the second period do not overlap each other. Further, it is preferable that a period which does not belong to any of the periods is provided between the first period and the second period.

In the first period, the switches 121 and 122 of the pixel unit 11 are set to the OFF state, and the switches 221 and 222 of the correction unit 21 are set to the ON state. In this case, the first input terminal 201 and the second input terminal 202 of the null amplifier 200 are electrically connected to each other, and the third input terminal 203 and the output terminal 204 are electrically connected to each other. Therefore, the voltage value $V_{2out}$ output from the output terminal 204 of the null amplifier 200 is represented by the following Formula (3). The Formula is transformed into the following Formula (4). This voltage value $V_{2out}$ is held in the capacitive element 211.

[Formula 3]

$$V_{2out} = G_{21}V_{2OS} - G_{23}V_{2out} \quad (3)$$

[Formula 4]

$$V_{2out} = \frac{G_{21}V_{2OS}}{1 + G_{23}} \quad (4)$$

In the second period, the switches 121 and 122 of the pixel unit 11 are set to the ON state, and the switches 221 and 222 of the correction unit 21 are set to the OFF state. In this case, the voltage value $V_{2out}$ output from the output terminal 204 of the null amplifier 200 is represented by the above Formula (2). The voltage value $V_{23}$ of the third input terminal 203 of the null amplifier 200 is represented by the right side of the above Formula (4). Further, $V_{21} = V_{11}$. Therefore, using Formula (2) and Formula (4), the voltage value $V_{2out}$ is represented by the following Formula (5). The Formula is transformed into the following Formula (6). As can be seen from the Formula, the effective offset voltage of the null amplifier 200 becomes small.

[Formula 5]

$$V_{2out} = G_{21}(V_{11} + V_{2OS}) - G_{23}\frac{G_{21}V_{2OS}}{1 + G_{23}} \quad (5)$$

[Formula 6]

$$V_{2out} = G_{21}V_{11} + \frac{G_{21}V_{2OS}(1 + G_{23}) - G_{21}G_{23}V_{2OS}}{1 + G_{23}} = G_{21}\left(V_{11} + \frac{V_{2OS}}{1 + G_{23}}\right) \quad (6)$$

The voltage value $V_{1out}$ output from the output terminal 104 of the main amplifier 100 in the second period is represented by the above Formula (1). Further, the voltage value $V_{13}$ of the third input terminal 103 of the main amplifier 100 is represented by the rightmost side of the above Formula (6). Therefore, using Formula (1) and Formula (6), the voltage value $V_{1out}$ is represented by the following Formula (7). The Formula is transformed into the following Formula (8).

[Formula 7]

$$V_{1out} = G_{11}(V_{11} + V_{1OS}) + G_{13}G_{21}\left(V_{11} + \frac{V_{2OS}}{1 + G_{23}}\right) \quad (7)$$

-continued

[Formula 8]

$$V_{1out} = (G_{11} + G_{13}G_{21})V_{11} + G_{11}V_{1OS} + \frac{G_{13}G_{21}V_{2OS}}{1 + G_{23}} \quad (8)$$

In addition, when the gains $G_{11}$, $G_{13}$, $G_{21}$, and $G_{23}$ have a relation of the following Formula (9), the above Formula (8) is represented by the following Formula (10). The Formula is transformed into the following Formula (11). As can be seen from the Formula, the effective gain of the main amplifier 100 is $G_{21}G_{23}$ (=$G_{11}G_{13}$), which is very large. Further, the effective offset voltage of the main amplifier 100 is ($V_{1OS}$+$V_{2OS}$)/$G_{23}$, which is very small.

[Formula 9]

$$G_{11} = G_{21}, \quad G_{13} = G_{23}, \quad G_{23} \gg 1 \quad (9)$$

[Formula 10]

$$V_{1out} = G_{21}G_{23}V_{11} + G_{21}(V_{1OS} + V_{2OS}) \quad (10)$$

[Formula 11]

$$V_{1out} = G_{21}G_{23}\left(V_{11} + \frac{V1_{OS} + V_{2OS}}{G_{23}}\right) \quad (11)$$

Figure 3:
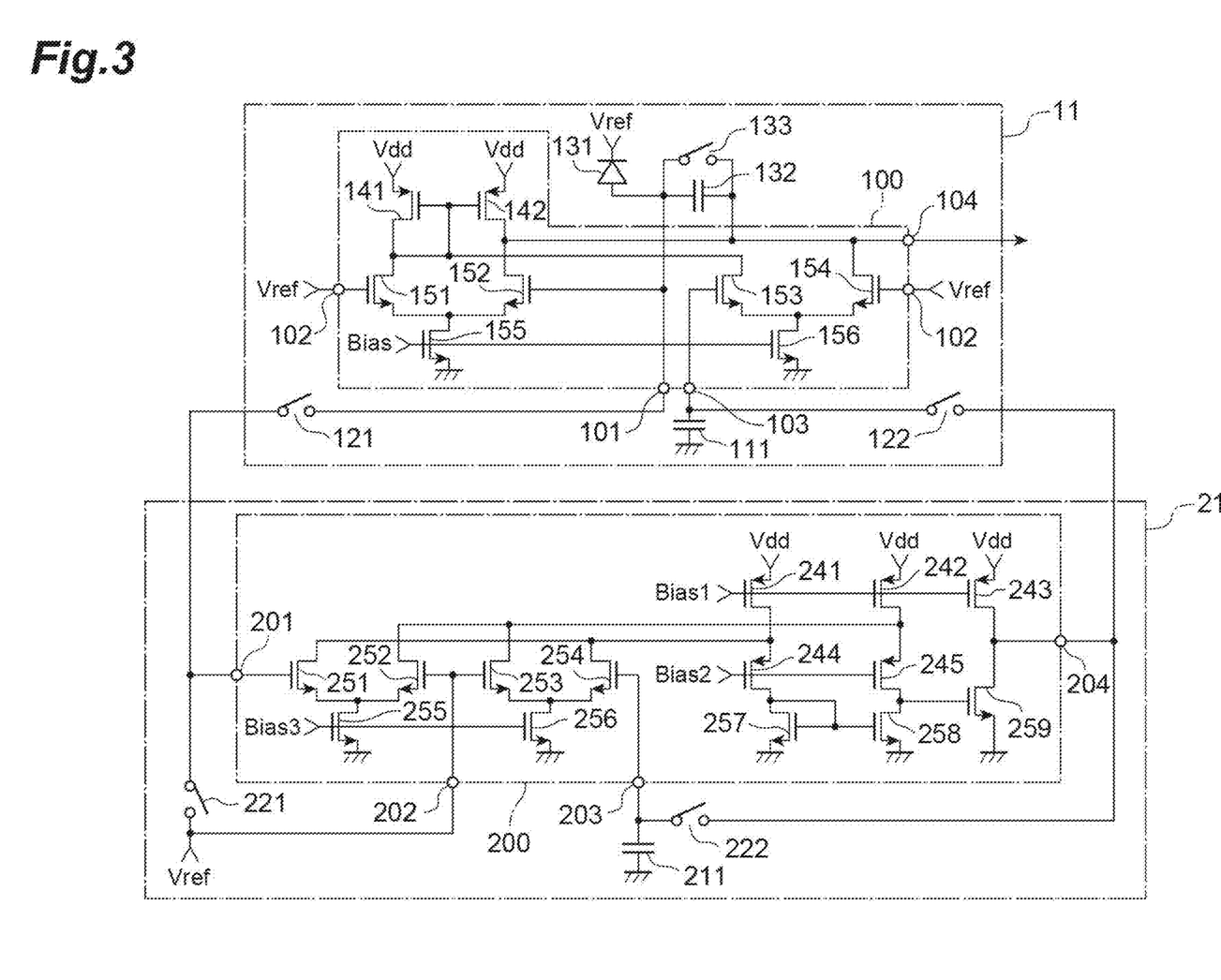
FIG. 3 is a diagram illustrating a specific circuit configuration example of the pixel unit 11 and the correction unit 21.

Next, a specific circuit configuration example of the pixel unit 11 (in particular, the main amplifier 100) and the correction unit 21 (in particular, the null amplifier 200) will be described with reference to FIG. 3. In addition, the circuit configuration described here is one example, and other circuit configurations can be used.

The main amplifier 100 includes PMOS transistors 141 and 142 and NMOS transistors 151 to 156.

A source of each of the PMOS transistors 141 and 142 is set to a power potential. A drain of the NMOS transistor 151 is connected to a drain and a gate of the PMOS transistor 141, and is connected to a gate of the PMOS transistor 142. A gate of the NMOS transistor 151 is connected to the second input terminal 102. A drain of the NMOS transistor 152 is connected to a drain of the PMOS transistor 142 and the output terminal 104. A gate of the NMOS transistor 152 is connected to the first input terminal 101.

A drain of the NMOS transistor 153 is connected to the drain and the gate of the PMOS transistor 141, and is connected to the gate of the PMOS transistor 142. A gate of the NMOS transistor 153 is connected to the third input terminal 103. A drain of the NMOS transistor 154 is connected to the drain of the PMOS transistor 142 and the output terminal 104. A gate of the NMOS transistor 154 is connected to the second input terminal 102.

A drain of the NMOS transistor 155 is connected to a source of each of the NMOS transistors 151 and 152. A drain of the NMOS transistor 156 is connected to a source of each of the NMOS transistors 153 and 154. A source of each of the NMOS transistors 155 and 156 is set to the ground potential. Each of the NMOS transistors 155 and 156 acts as a current source with a bias voltage Bias applied to a gate.

The null amplifier 200 includes PMOS transistors 241 to 245 and NMOS transistors 251 to 259.

A source of each of the PMOS transistors 241 to 243 is set to the power potential. A source of the PMOS transistor 244 is connected to a drain of the PMOS transistor 241. A source of the PMOS transistor 245 is connected to a drain of the PMOS transistor 242. Each of the PMOS transistors 241 to 243 acts as a current source with a bias voltage Bias1 applied to a gate. Each of the PMOS transistors 244 and 245 acts as a cascode transistor with a bias voltage Bias2 applied to a gate.

A drain of the NMOS transistor 251 is connected to the drain of the PMOS transistor 241. A gate of the NMOS transistor 251 is connected to the first input terminal 201. A drain of the NMOS transistor 252 is connected to the drain of the PMOS transistor 242. A gate of the NMOS transistor 252 is connected to the second input terminal 202.

A drain of the NMOS transistor 253 is connected to the drain of the PMOS transistor 242. A gate of the NMOS transistor 253 is connected to the second input terminal 202. A drain of the NMOS transistor 254 is connected to the drain of the PMOS transistor 241. A gate of the NMOS transistor 254 is connected to the third input terminal 203.

A drain of the NMOS transistor 255 is connected to a source of each of the NMOS transistors 251 and 252. A drain of the NMOS transistor 256 is connected to a source of each of the NMOS transistors 253 and 254. A source of each of the NMOS transistors 255 and 256 is set to the ground potential. Each of the NMOS transistors 255 and 256 acts as a current source with a bias voltage Bias3 applied to a gate.

A drain of the NMOS transistor 257 is connected to a drain of the PMOS transistor 244. A drain of the NMOS transistor 258 is connected to a drain of the PMOS transistor 245. A gate of each of the NMOS transistors 257 and 258 is connected to the drain of the NMOS transistor 257.

A drain of the NMOS transistor 259 is connected to a drain of the PMOS transistor 243 and the output terminal 204. A gate of the NMOS transistor 259 is connected to the drain of the PMOS transistor 245. A source of each of the NMOS transistors 257 to 259 is set to the ground potential.

Next, an operation example of the solid-state imaging device 1A will be described with reference to a timing chart of FIG. 4. The solid-state imaging device 1A operates under control by the control unit 30A.

In a period in which a control signal Reset_m output from the control unit 30A is at a high level, the initialization switch 133 of the pixel unit 11$_m$ is set to the ON state, and the charge accumulation in the feedback capacitive element 132 is initialized. In a period in which the control signal Reset_m is at a low level, the initialization switch 133 of the pixel unit 11$_m$ is set to the OFF state, and the charge is accumulated in the feedback capacitive element 132. The control unit 30A provides the control signal Reset_m to each pixel unit 11$_m$ to control ON/OFF of the initialization switch 133 of the pixel unit 11$_m$, thereby performing the initialization and the charge accumulation of the feedback capacitive element 132.

In a period in which a control signal Row_m output from the control unit 30A is at the high level, the switches 121 and 122 of the pixel unit 11$_m$ are set to the ON state. In a period in which the control signal Row_m is at the low level, the switches 121 and 122 of the pixel unit 11$_m$ are set to the OFF state. The control unit 30A provides the control signal Row_m to each pixel unit 11$_m$ to set the switches 121 and 122 to the ON state sequentially for each of the M pixel units 11$_1$ to 11$_M$.

In a period in which a control signal ϕ output from the control unit 30A is at the high level, the switches 221 and 222 of the correction unit 21 are set to the ON state. In a period in which the control signal ϕ is at the low level, the switches 221 and 222 of the correction unit 21 are set to the OFF state. The control unit 30A provides the control signal ϕ to the correction unit 21 to set the switches 221 and 222 of the correction unit 21 to the ON state in a period in which the switches 121 and 122 of all of the M pixel units 11$_1$ to $11_M$ are set to the OFF state (that is, in a period in which all the M control signals Row_1 to Row_M are at the low level).

The control unit 30A may set the switches 221 and 222 of the correction unit 21 to the ON state a plurality of times in a period in which the initialization switch 133 is set to the OFF state and the charge accumulation is performed by the feedback capacitive element 132 for each of the M pixel units $11_1$ to $11_M$ (that is, in a period in which the control signal Reset_m is at the low level). In this way, the solid-state imaging device 1A can increase charge accumulation time and perform imaging with an excellent SN ratio even with weak light.

In the present embodiment, when the solid-state imaging device is formed on a semiconductor substrate, a forming region of the first circuit unit 10A and a forming region of the second circuit unit 20A can be separated from each other. Therefore, since a layout area of each pixel unit $11_m$ can be reduced in the forming region of the first circuit unit 10A, it is possible to narrow a pitch of the pixels. Further, since the effective offset voltage of the main amplifier 100 can be made very small by each pixel unit $11_m$ including the main amplifier 100 and the correction unit 21 including the null amplifier 200, temperature control of the solid-state imaging device 1A can be made unnecessary, or even when the temperature control is performed, the temperature control can be performed in a simple and inexpensive configuration using, for example, a Peltier element.

Figure 5:
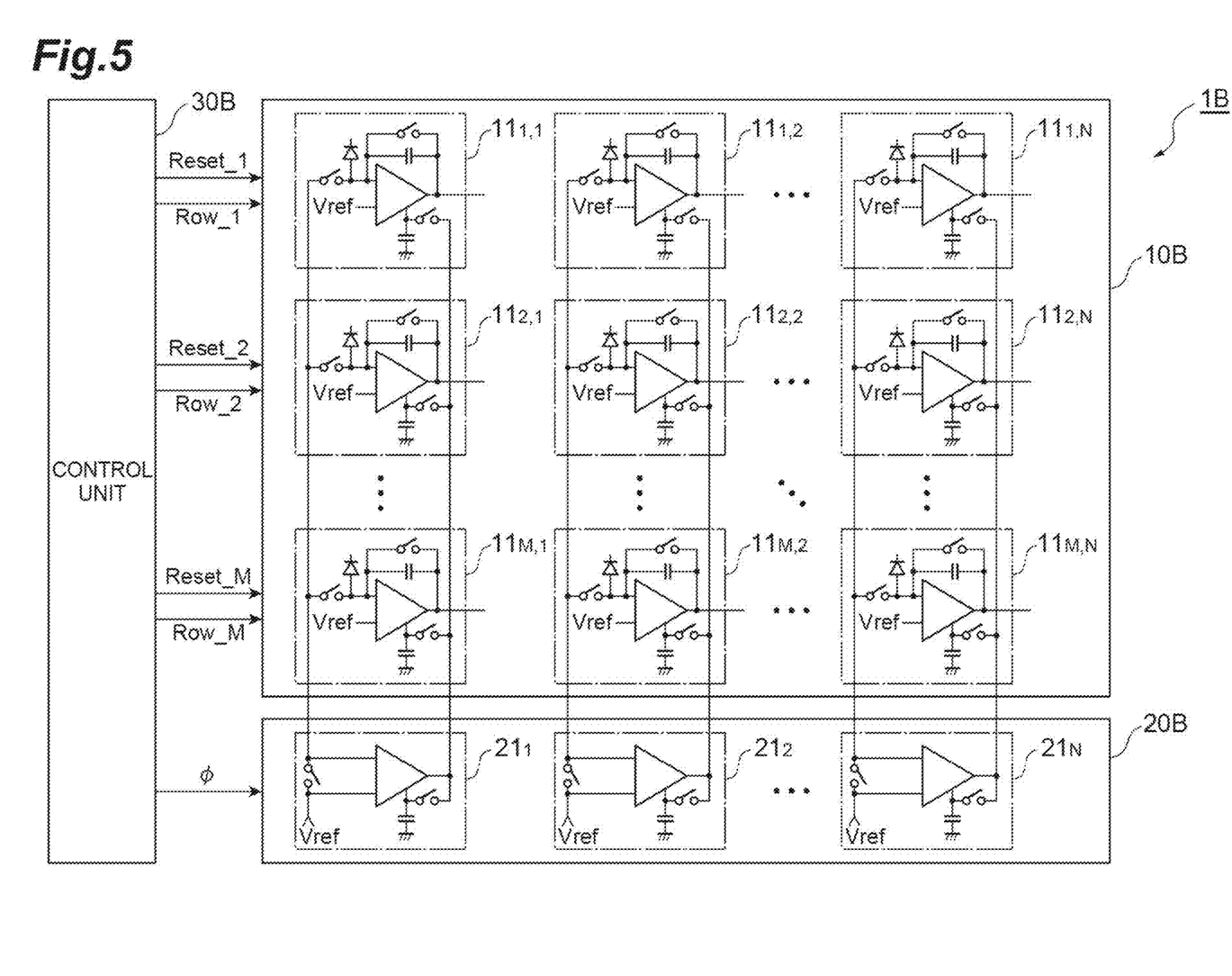
FIG. 5 is a diagram illustrating a configuration of a solid-state imaging device 1B according to a second embodiment.

Next, a second embodiment will be described. FIG. 5 is a diagram illustrating a configuration of a solid-state imaging device 1B according to the second embodiment. The solid-state imaging device 1B includes a first circuit unit 10B including MN pixel units $11_{1,1}$ to $11_{M,N}$, a second circuit unit 20B including N correction units $21_1$ to $21_N$, and a control unit 30B.

The first circuit unit 10B and the second circuit unit 20B in the second embodiment correspond to N columns of the first circuit unit 10A and the second circuit unit 20A in the first embodiment being arranged in parallel. The single correction unit $21_n$ is provided for the M pixel units $11_{1,n}$ to $11_{M,n}$ of the n-th column. The MN pixel units $11_{1,1}$ to $11_{M,N}$ are arranged two-dimensionally in M rows and N columns. The pixel unit $11_{m,n}$ is located at the m-th row and the n-th column. In addition, each of M and N is an integer of 2 or more, m is an integer of 1 or more and M or less, and n is an integer of 1 or more and N or less.

The MN pixel units $11_{1,1}$ to $11_{M,N}$ have a common configuration. The N correction units $21_1$ to $21_N$ also have a common configuration. Each pixel unit $11_{m,n}$ and each correction unit 21 has the configuration illustrated in FIG. 2 and FIG. 3. The control unit 30B controls ON/OFF of each switch included in each pixel unit $11_{m,n}$ and each correction unit $21_n$.

The control signal Row_m output from the control unit 30B controls ON/OFF of the switches 121 and 122 of each of the N pixel units $11_{m,1}$ to $11_{m,N}$ of the m-th row. The control signal Reset_m output from the control unit 30B controls ON/OFF of the switch 133 of each of the N pixel units $11_{m,1}$ to $11_{m,N}$ of the m-th row. The control signal $\phi$ output from the control unit 30B controls ON/OFF of the switches 221 and 222 of each of the N correction units $21_1$ to $21_N$.

Figure 4:
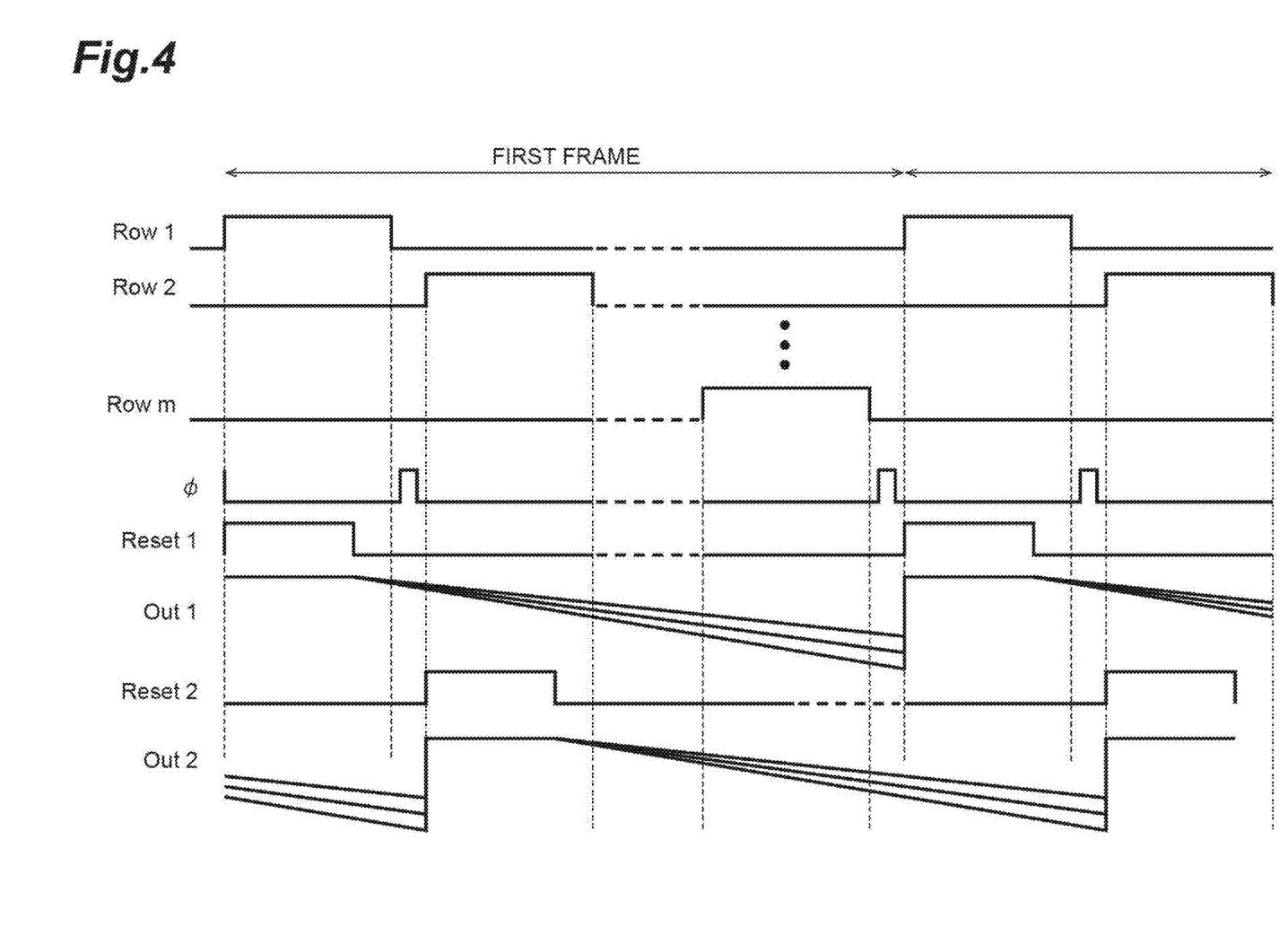
FIG. 4 is a timing chart for describing an operation example of the solid-state imaging device 1A.

Each column of the solid-state imaging device 1B of the second embodiment can perform the same operation as the operation of the solid-state imaging device 1A of the first embodiment described in FIG. 4. Therefore, the solid-state imaging device 1B of the second embodiment can acquire a two-dimensional image while exhibiting the same effect as the solid-state imaging device 1A of the first embodiment.

Figure 6:
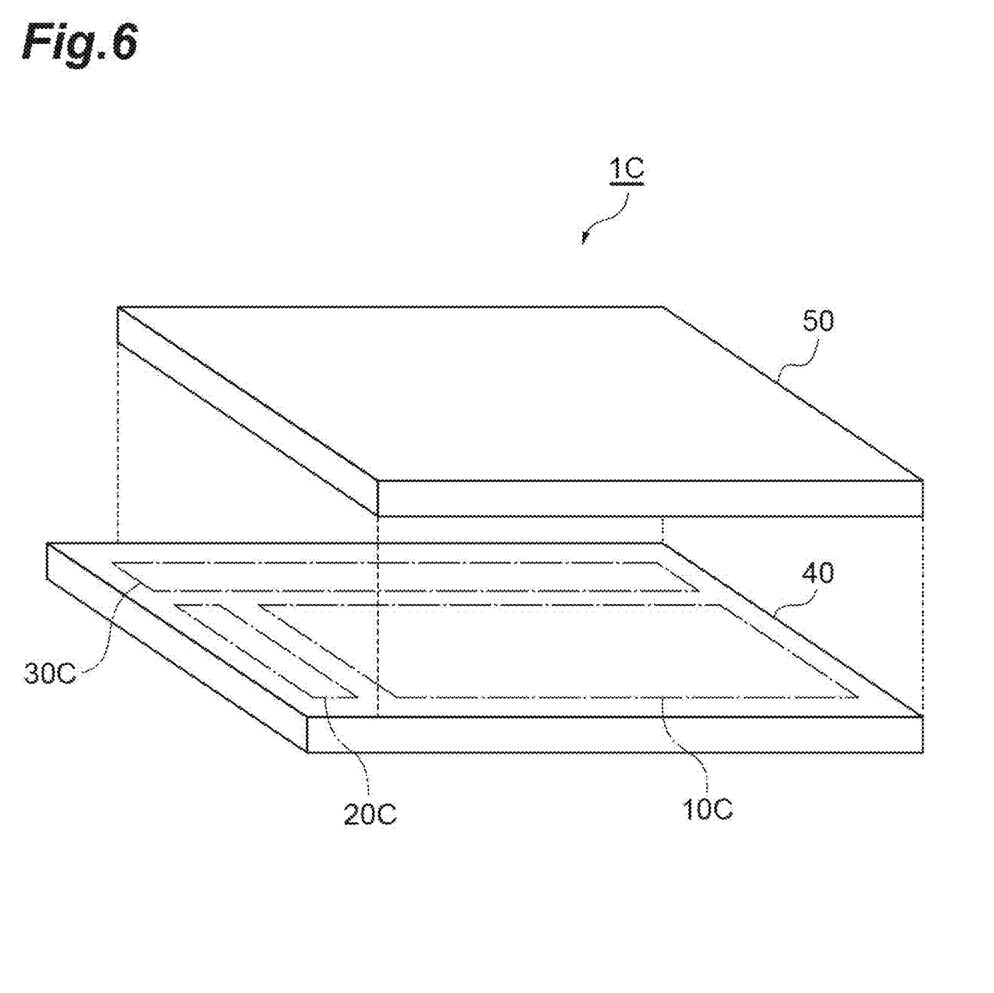
FIG. 6 is a diagram illustrating a configuration of a solid-state imaging device 1C according to a third embodiment.

Next, a third embodiment will be described. FIG. 6 is a diagram illustrating a configuration of a solid-state imaging device 1C according to the third embodiment. The solid-state imaging device 1C includes an amplifier array 40 and a photodiode array 50.

The amplifier array 40 includes a first circuit unit 10C and a second circuit unit 20C formed on a first semiconductor substrate. The amplifier array 40 may further include a control unit 30C formed on the first semiconductor substrate. The photodiode array 50 includes a plurality of photodiodes formed on a second semiconductor substrate. In addition, the control unit 30C may not be formed on the first semiconductor substrate, and for example, may be formed on another semiconductor substrate or a printed board connected to the first semiconductor substrate, or may be a device (for example, computer) connected to the first semiconductor substrate.

The first circuit unit 10C in the third embodiment has a configuration obtained by excluding all the photodiodes 131 from the first circuit unit 10A in the first embodiment. The second circuit unit 20C in the third embodiment has the same configuration as the second circuit unit 20A in the first embodiment. The control unit 30C in the third embodiment performs the same control as the control unit 30A in the first embodiment.

Alternatively, the first circuit unit 10C in the third embodiment has a configuration obtained by excluding all the photodiodes 131 from the first circuit unit 10B in the second embodiment. The second circuit unit 20C in the third embodiment has the same configuration as the second circuit unit 20B in the second embodiment. The control unit 30C in the third embodiment performs the same control as the control unit 30B in the second embodiment.

The first input terminal 101 of the main amplifier 100 of each pixel unit 11 in the amplifier array 40 and each photodiode in the photodiode array 50 are connected in one-to-one correspondence. In this connection, a through-hole electrode and a bump electrode are used. As a result of the connection, the solid-state imaging device 1A of the first embodiment or the solid-state imaging device 1B of the second embodiment is obtained.

In the present embodiment, the photodiode array 50 does not include a readout circuit such as the main amplifier 100 and the plurality of photodiodes are formed on the second semiconductor substrate, and thus, it is possible to further narrow the pitch of the pixels.

Further, in the present embodiment, the first semiconductor substrate on which the amplifier array 40 is formed and the second semiconductor substrate on which the photodiode array 50 is formed may be made of the same material, and further, may be made of different materials. For example, by using a Si substrate as the first semiconductor substrate, each MOS transistor constituting the main amplifier 100 and the null amplifier 200 can be suitably formed. Further, by selecting and using a substrate made of Si or a compound semiconductor (for example, InGaAs-based, InAsSb-based, and the like) as the second semiconductor substrate, a photodiode having sensitivity in a wavelength region desired to be measured or imaged can be suitably formed.

The solid-state imaging device and the amplifier array according to the present invention are not limited to the embodiments and configuration examples described above, and various modifications can be made.

The solid-state imaging device of the above embodiment includes a plurality of pixel units; a correction unit; and a control unit.

In the above solid-state imaging device, each of the plurality of pixel units includes (1) a main amplifier having a first input terminal, a second input terminal, a third input terminal, and an output terminal, and for outputting, from the output terminal, a voltage value according to a sum of a product of a first gain and a potential difference between the first input terminal and the second input terminal and a product of a second gain and a potential difference between the third input terminal and the second input terminal; (2) a capacitive element connected to the third input terminal of the main amplifier; (3) a first switch connected to the first input terminal of the main amplifier; (4) a second switch connected to the third input terminal of the main amplifier; (5) a photodiode connected to the first input terminal of the main amplifier; (6) a feedback capacitive element provided between the first input terminal and the output terminal of the main amplifier, and for accumulating a charge generated in the photodiode in response to light incidence; and (7) an initialization switch provided in parallel with the feedback capacitive element.

In the above solid-state imaging device, the correction unit includes (1) a null amplifier having a first input terminal, a second input terminal, a third input terminal, and an output terminal, the first input terminal being connected to the first switch of each of the plurality of pixel units, the output terminal being connected to the second switch of each of the plurality of pixel units, and for outputting, from the output terminal, a voltage value according to a difference between a product of a first gain and a potential difference between the first input terminal and the second input terminal and a product of a second gain and a potential difference between the third input terminal and the second input terminal; (2) a capacitive element connected to the third input terminal of the null amplifier; (3) a first switch provided between the first input terminal and the second input terminal of the null amplifier; and (4) a second switch provided between the third input terminal and the output terminal of the null amplifier.

In the above solid-state imaging device, the control unit is configured to perform initialization and charge accumulation of the feedback capacitive element by controlling ON/OFF of the initialization switch for each of the plurality of pixel units, set the first switch and the second switch to an ON state sequentially for each of the plurality of pixel units, and set the first switch and the second switch of the correction unit to the ON state in a period in which the first switches and the second switches of all of the plurality of pixel units are set to an OFF state.

In the above solid-state imaging device, the control unit may be configured to set the first switch and the second switch of the correction unit to the ON state a plurality of times in a period in which the initialization switch is set to the OFF state and the charge accumulation is performed by the feedback capacitive element for each of the plurality of pixel units.

In the above solid-state imaging device, a plurality of sets of the plurality of pixel units and the correction unit may be provided. Further, in the above solid-state imaging device, the plurality of sets of the plurality of pixel units may be arranged two-dimensionally.

The amplifier array of the above embodiment includes a plurality of pixel units; and a correction unit formed on a first semiconductor substrate.

In the above amplifier array, each of the plurality of pixel units includes (1) a main amplifier having a first input terminal, a second input terminal, a third input terminal, and an output terminal, and for outputting, from the output terminal, a voltage value according to a sum of a product of a first gain and a potential difference between the first input terminal and the second input terminal and a product of a second gain and a potential difference between the third input terminal and the second input terminal; (2) a capacitive element connected to the third input terminal of the main amplifier; (3) a first switch connected to the first input terminal of the main amplifier; (4) a second switch connected to the third input terminal of the main amplifier; (5) a feedback capacitive element provided between the first input terminal and the output terminal of the main amplifier; and (6) an initialization switch provided in parallel with the feedback capacitive element.

In the above amplifier array, the correction unit includes (1) a null amplifier having a first input terminal, a second input terminal, a third input terminal, and an output terminal, the first input terminal being connected to the first switch of each of the plurality of pixel units, the output terminal being connected to the second switch of each of the plurality of pixel units, and for outputting, from the output terminal, a voltage value according to a difference between a product of a first gain and a potential difference between the first input terminal and the second input terminal and a product of a second gain and a potential difference between the third input terminal and the second input terminal; (2) a capacitive element connected to the third input terminal of the null amplifier; (3) a first switch provided between the first input terminal and the second input terminal of the null amplifier; and (4) a second switch provided between the third input terminal and the output terminal of the null amplifier.

In the above amplifier array, a control unit may be formed on the first semiconductor substrate, and the control unit may be configured to control ON/OFF of the initialization switch for each of the plurality of pixel units, set the first switch and the second switch to an ON state sequentially for each of the plurality of pixel units, and set the first switch and the second switch of the correction unit to the ON state in a period in which the first switches and the second switches of all of the plurality of pixel units are set to an OFF state.

In the above amplifier array, a plurality of sets of the plurality of pixel units and the correction unit may be formed on the first semiconductor substrate.

The solid-state imaging device of the above embodiment includes the amplifier array of the above configuration; and a photodiode array including a plurality of photodiodes formed on a second semiconductor substrate, and the first input terminal of the main amplifier of each pixel unit in the amplifier array and each photodiode in the photodiode array are connected in one-to-one correspondence.

In the above solid-state imaging device, the photodiode may be formed of a compound semiconductor. Further, in the above solid-state imaging device, the photodiode may be formed of an InGaAs-based or InAsSb-based compound semiconductor.

INDUSTRIAL APPLICABILITY

The present invention can be used as a solid-state imaging device in which temperature control is unnecessary or simple and a pitch of pixels can be narrowed, and an amplifier array suitably used in the solid-state imaging device.

REFERENCE SIGNS LIST 1A-1C—solid-state imaging device, 10A-10C—first circuit unit, 11, $11_1$-$11_M$, $11_{1,1}$-$11_{M,N}$—pixel unit, 20A-20C—second circuit unit, 21, $21_1$-$21_N$—correction unit, 30A-30C—control unit, 40—amplifier array, 50—photodiode array, 100—main amplifier, 101—first input terminal, 102—second input terminal, 103—third input terminal, 104—output terminal, 111—capacitive element, 121—first switch, 122—second switch, 131—photodiode, 132—feedback capacitive element, 133—initialization switch, 200—null amplifier, 201—first input terminal, 202—second input terminal, 203—third input terminal, 204—output terminal, 211—capacitive element, 221—first switch, 222—second switch, 141, 142—PMOS transistor, 151-156—NMOS transistor, 241-245—PMOS transistor, 251-259—NMOS transistor.

The invention claimed is:

1. A solid-state imaging device comprising:
a plurality of pixel units; a correction unit; and a control unit, wherein
each of the plurality of pixel units includes:
a main amplifier having a first input terminal, a second input terminal, a third input terminal, and an output terminal, and configured to output, from the output terminal, a voltage value according to a sum of a product of a first gain and a potential difference of the first input terminal with respect to the second input terminal and a product of a second gain and a potential difference of the third input terminal with respect to the second input terminal;
a capacitive element connected to the third input terminal of the main amplifier;
a first switch connected to the first input terminal of the main amplifier;
a second switch connected to the third input terminal of the main amplifier;
a photodiode connected to the first input terminal of the main amplifier;
a feedback capacitive element provided between the first input terminal and the output terminal of the main amplifier, and configured to accumulate a charge generated in the photodiode in response to light incidence; and
an initialization switch provided in parallel with the feedback capacitive element,
the correction unit includes:
a null amplifier having a first input terminal, a second input terminal, a third input terminal, and an output terminal, the first input terminal being connected to the first switch of each of the plurality of pixel units, the output terminal being connected to the second switch of each of the plurality of pixel units, and configured to output, from the output terminal, a voltage value according to a difference between a product of a first gain and a potential difference of the first input terminal with respect to the second input terminal and a product of a second gain and a potential difference of the third input terminal with respect to the second input terminal;
a capacitive element connected to the third input terminal of the null amplifier;
a first switch provided between the first input terminal and the second input terminal of the null amplifier; and
a second switch provided between the third input terminal and the output terminal of the null amplifier, and
the control unit is configured to:
perform initialization and charge accumulation of the feedback capacitive element by controlling ON/OFF of the initialization switch for each of the plurality of pixel units,
set the first switch and the second switch to an ON state sequentially for each of the plurality of pixel units, and
set the first switch and the second switch of the correction unit to the ON state in a period in which the first switches and the second switches of all of the plurality of pixel units are set to an OFF state.

2. The solid-state imaging device according to claim 1, wherein the control unit is configured to set the first switch and the second switch of the correction unit to the ON state a plurality of times in a period in which the initialization switch is set to the OFF state and the charge accumulation is performed by the feedback capacitive element for each of the plurality of pixel units.

3. The solid-state imaging device according to claim 1, comprising a plurality of sets of the plurality of pixel units and the correction unit.

4. The solid-state imaging device according to claim 3, wherein the plurality of sets of the plurality of pixel units are arranged two-dimensionally.

5. The solid-state imaging device according to claim 1, wherein the photodiode is formed of a compound semiconductor.

6. The solid-state imaging device according to claim 5, wherein the photodiode is formed of an InGaAs-based or InAsSb-based compound semiconductor.

7. An amplifier array comprising:
a plurality of pixel units; and a correction unit formed on a first semiconductor substrate, wherein
each of the plurality of pixel units includes:
a main amplifier having a first input terminal, a second input terminal, a third input terminal, and an output terminal, and configured to output, from the output terminal, a voltage value according to a sum of a product of a first gain and a potential difference of the first input terminal with respect to the second input terminal and a product of a second gain and a potential difference of the third input terminal with respect to the second input terminal;
a capacitive element connected to the third input terminal of the main amplifier;
a first switch connected to the first input terminal of the main amplifier;
a second switch connected to the third input terminal of the main amplifier;
a feedback capacitive element provided between the first input terminal and the output terminal of the main amplifier; and
an initialization switch provided in parallel with the feedback capacitive element, and
the correction unit includes:
a null amplifier having a first input terminal, a second input terminal, a third input terminal, and an output terminal, the first input terminal being connected to the first switch of each of the plurality of pixel units, the output terminal being connected to the second switch of each of the plurality of pixel units, and configured to output, from the output terminal, a voltage value according to a difference between a product of a first gain and a potential difference of the first input terminal with respect to the second input terminal and a product of a second gain and a potential difference of the third input terminal with respect to the second input terminal;

a capacitive element connected to the third input terminal of the null amplifier;

a first switch provided between the first input terminal and the second input terminal of the null amplifier; and a second switch provided between the third input terminal and the output terminal of the null amplifier.

8. The amplifier array according to claim 7, wherein a control unit is formed on the first semiconductor substrate, and the control unit is configured to:

control ON/OFF of the initialization switch for each of the plurality of pixel units, set the first switch and the second switch to an ON state sequentially for each of the plurality of pixel units, and set the first switch and the second switch of the correction unit to the ON state in a period in which the first switches and the second switches of all of the plurality of pixel units are set to an OFF state.

9. The amplifier array according to claim 7, wherein a plurality of sets of the plurality of pixel units and the correction unit are formed on the first semiconductor substrate.

10. A solid-state imaging device comprising:

the amplifier array according to claim 7; and a photodiode array including a plurality of photodiodes formed on a second semiconductor substrate, wherein the first input terminal of the main amplifier of each pixel unit in the amplifier array and each photodiode in the photodiode array are connected in one-to-one correspondence.

11. The solid-state imaging device according to claim 10, wherein the photodiode is formed of a compound semiconductor.

12. The solid-state imaging device according to claim 11, wherein the photodiode is formed of an InGaAs-based or InAsSb-based compound semiconductor.

* * * * *